United States Patent
Wald et al.

(10) Patent No.: US 6,518,739 B2
(45) Date of Patent: Feb. 11, 2003

(54) ZERO-VOLTAGE-SWITCH SNUBBER CIRCUIT

(75) Inventors: Roland Wald, Skärholmen (SE); Nils Bäckman, Stockholm (SE)

(73) Assignee: Emerson Energy Systems AB, Stockholm (SE)

( * ) Notice: Subject to any disclaimer, the term of this patent is extended or adjusted under 35 U.S.C. 154(b) by 0 days.

(21) Appl. No.: 09/980,028

(22) PCT Filed: Mar. 22, 2001

(86) PCT No.: PCT/SE01/00620
§ 371 (c)(1),
(2), (4) Date: Mar. 26, 2002

(87) PCT Pub. No.: WO01/73948
PCT Pub. Date: Oct. 4, 2001

(65) Prior Publication Data
US 2002/0118003 A1 Aug. 29, 2002

(30) Foreign Application Priority Data
Mar. 24, 2000 (SE) ................................................ 0001054

(51) Int. Cl.[7] ................................................ H02H 7/12
(52) U.S. Cl. ...................... 323/351; 323/282; 361/18; 363/56.12
(58) Field of Search ................. 323/222, 282, 323/351; 361/18; 363/56.05, 56.08, 56.11, 56.12

(56) References Cited

U.S. PATENT DOCUMENTS

| | | | |
|---|---|---|---|
| 5,418,704 A | | 5/1995 | Hua et al. ...................... 363/21 |
| 5,461,302 A | * | 10/1995 | Garcia et al. ................. 323/351 |
| 5,636,114 A | * | 6/1997 | Bhagwat et al. ............... 363/56 |
| 5,793,190 A | * | 8/1998 | Sahlstrom et al. ........... 323/222 |
| 5,815,386 A | * | 9/1998 | Gordon ........................ 363/56 |
| 5,828,559 A | * | 10/1998 | Chen ............................. 363/56 |
| 5,841,268 A | * | 11/1998 | Mednik ....................... 323/222 |

(List continued on next page.)

OTHER PUBLICATIONS

Yungtack Jang and Milan M. Jovanovi, "A New, Soft-Switched, High-Power-Factor Boost Converter with IGBTs", The 21st Internatinoal Telecommunicatinos Energy Conference Jun., 1999.*

Y.M Jiang, G.C. Ilua, E.X. Yang, and F.C. Lee, "Soft-Switching of IGBT's With The Help of MOSFET's", VPEC Tenth Annual Power Electronics Seminar, Sep., 1992, pp. 77–87.*

Guichao Hua, Eric X. Yang, Yimin Jiang, and Fred C. Lee, "Novel Zero-Current-Transition PWM Converteres", IEEE, Dec. 1993.*

(List continued on next page.)

Primary Examiner—Jeffrey Sterrett
(74) Attorney, Agent, or Firm—Harness, Dickey & Pierce, P.L.C.

(57) ABSTRACT

A new ZVS (zero-voltage-switching) snubber circuit suitable for high power boost converters used as power factor correction circuits used in AC-to-DC modules. The ZVS circuit comprises a main switch, an auxiliary switch, a load circuit, a reset circuit, a first diode, a blocking diode, and a first capacitor. The switches and the capacitor are connected in parallel. The circuit includes a blocking diode having an anode terminal connected to a drain terminal of the auxiliary switch and a cathode terminal connected to the reset circuit. At turn-off, the current tail of the main switch is taken over by the auxiliary switch. The ZVS circuit keeps the collector-emitter voltage of main switch almost zero, so that the turn-off loss is minimized.

23 Claims, 6 Drawing Sheets

U.S. PATENT DOCUMENTS

| | | | | |
|---|---|---|---|---|
| 5,959,438 A | * | 9/1999 | Jovanovic et al. | 323/222 |
| 6,008,630 A | * | 12/1999 | Prasad | 323/222 |
| 6,023,158 A | * | 2/2000 | Liu | 323/351 |
| 6,028,418 A | | 2/2000 | Jovanovic et al. | 323/222 |
| 6,051,961 A | | 4/2000 | Jang et al. | 323/224 |
| 6,060,867 A | | 5/2000 | Farrington et al. | 323/222 |
| 6,236,191 B1 | * | 5/2001 | Chaffai | 323/222 |
| 6,434,029 B1 | * | 8/2002 | Cyr et al. | 323/222 |

OTHER PUBLICATIONS

Kunrong Wang, Fred C. Lee, Guichao Hua and Dusan Borojevic, "A Comparative Study Of Switching Losses Of Switching Losses Of IGBTS Under Hard–Swithcing, Zero–Voltage Switching And Zero–Current Switching", IEEE, May 1994.*

* cited by examiner

ZERO-VOLTAGE-SWITCH SNUBBER CIRCUIT

TECHNICAL FIELD

The present invention relates to protection against overheating of power electronic semiconductor switches connected in series with a load.

BACKGROUND OF THE INVENTION

The IGBT is nowadays a natural choice for the designers of high power processing electronic circuits. However, the current tail of the IGBT, at turn-off, will introduce high switching losses and thus impose an unnecessary low limit of the power level that can be handled. A snubber circuit can be used as described by G. Hua, X. Yang, Y. Jiang, F. C. Lee, "Novel zero-current-transition PWM converters", IEEE Power Electronics Specialists' Conference (PESC), June 1993. Another snubber circuit is described by Y. Jang, M. M. Jovanovi, "A New, Soft-Switched, High-Power-Factor Boost Converter with IGBT's" IEEE International Telecommunication's Energy Conference, $21^{st}$ INTELEC, June 1999.

A straight—forward way of dealing with the current tail problem of the IGBT is to connect a MOSFET in parallel with the IGBT. The IGBT is used for reduction of the conduction losses and the MOSFET reduces the turn-off losses, in Y. M. Jiang, G. C. Hua, E. X. Yang, F. C. Lee, "Soft-Switching of IGBT's with the help of MOSFET's", Proceedings of the Virginia Power Electronics Conference, Sep. 20–22, 1992, pp. 77–84. The disadvantage of this approach is that the output capacitance of the MOSFET increases switching losses at turn-on.

By using Zero-Voltage-Switching, ZVS,—at the time of turn-on, one is able to add capacitance to limit dv/dt at turn-off. An interesting comparative study was performed in K. Wang, F. C. Lee, G. Hua, D. Borojevic, "A comparative study of switching losses of IGBT's under hard-switching, zero-voltage switching and zero-current switching", IEEE Power Electronics Specialists' Conference (PESC), June 1994. A relatively large capacitor was introduced in parallel with the IGBT in order to limit the dv/dt of collector-emitter voltage at turn-off. Thus the current-voltage over-lap was reduced, which otherwise would have caused very high turn-off losses. Several 1200V/50A IGBTs were tested. The ZVS was compared to zero-current-switch ZCS-off. It turned out the ZVS-on concept was more efficient than the ZCS-off concept due to that by using ZVS-on one is able to add capacitance to limit dv/dt at turn-off.

A disadvantage may be that the optimum delay time varies between different types of the IGBT and vendors. Therefore, the delay needs to be long enough to include a margin for the worst case, (the longest current tail time). This disadvantage is not present to the same extent in the circuit presented in reference, "A New, Soft-Switched, High-Power-Factor Boost Converter with IGBT's" where the switching of the IGBT can be performed at zero current. The disadvantage of this circuit is that the snubber's MOSFET's VI-rating needs to be relatively large because the auxiliary switch in the snubber takes over the whole load current linearly during the on-time of the IGBT. This in turn is achieved by introducing a large circulating current in the snubber, which may deteriorate the overall efficiency.

Provided that the switching losses introduced by hard-turn-on of the IGBT are considered acceptable, it would still be necessary to reduce the losses introduced by the current tail if one wants to utilise the transistor to near its full capability.

Prior art for protection circuits are illustrated in FIG. 1–FIG. 4.

FIG. 1 shows a MOSFET S1 in parallel with the IGBT S. Upon turning off, the IGBT S is turned off first, and after a short delay the MOSFET S1 is turned off as well. In this way, the collector-emitter voltage of the IGBT will be kept low, while the current tail in the IGBT S is decaying to zero, so that the losses during this interval will be kept to a minimum. The disadvantage of this circuit is that the output capacitance of the MOSFET S1 will be discharged through the IGBT S, and/or the MOSFET S1 at turn-on.

FIG. 2 shows a snubber capacitor C1 in parallel with the IGBT S. The advantage and disadvantage are principally the same as in the described above with reference to FIG. 1.

In FIG. 3, a diode-capacitor clamping snubber is shown with a snubber diode D1 and a snubber capacitor C1. The snubber diode D1 is preventing the snubber capacitance C1 to discharge through the IGBT S. In order to reset the capacitor voltage to zero a reset circuit RC is needed as illustrated with a connection to a circuit symbolised by a box. The diode-capacitor clamping snubber as shown as D1, C1, would certainly reduce turn-off losses. However, the snubber capacitor C1 needs to be fully discharged before each turn-off of the IGBT.

In FIG. 4 a MOSFET S1 is connected in parallel with the IGBT S and a reset circuit RC is shown as an embodiment comprising a boost DC-to-DC-converter. The disadvantage with this circuit is the fact that the MOSFET S1 not only takes-over the current in the IGBT S through the diode D1, but also current flowing from the reset circuit RC connected to the drain terminal of the MOSFET S1 and cathode of the diode D1 causing a circulating current and additional conduction losses in the MOSFET S1.

DESCRIPTION OF THE INVENTION

It is an object of the present invention to overcome the problems as indicated above and to provide a zero-voltage-switching snubber circuit having improved characteristics.

This object is obtained by using an active switch, which keeps the collector-emitter voltage of the IGBT close to zero, so that the turn-off loss is minimised.

By introducing a circuit in parallel with the main switch (IGBT) the collector-emitter voltage can be clamped to almost zero during the time when the current tail is decaying to zero.

The circuit consists of an auxiliary switch, e.g. power MOSFET in parallel with a capacitor. The auxiliary switch and the capacitor are connected to the main switch via a diode. The diode prevents the capacitor from discharging through the main switch at turn-on.

A key feature of the invention is that circulating currents are minimised by a blocking diode, inter connected between an anode terminal of the blocking diode to the drain terminal of the auxiliary switch, and the cathode terminal of the blocking diode is connected to a reset circuit. The reset circuit is controlled in such a way, that it will discharge the output capacitor of the auxiliary switch while the main switch is conducting. After a delay, when the capacitor is fully discharged, the auxiliary switch is turned on under zero voltage condition.

An advantage of the present invention is that the gate drives for both switches are of the simple non-isolated type. Therefore there is no need for an extra control circuit; the same gate drive signal can be used for both switches with an addition of a simple delay of the gate drive signal of auxiliary switch. The auxiliary switch can be chosen with much smaller VI-rating than that of the main switch.

Another advantage of the present invention is that the proposed snubber does not introduce a need for higher voltage blocking capability of the transistors than what is required in an ordinary boost converter.

BRIEF DESCRIPTION OF THE DRAWINGS

The invention will now be described by way of non-limiting embodiments with reference to the accompanying drawings, in which.

DESCRIPTION OF PREFERRED EMBODIMENTS

Figure 1:
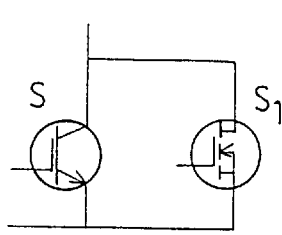
FIG. 1 shows a prior art circuit having an auxiliary switch in parallel with the main switch.
Figure 2:
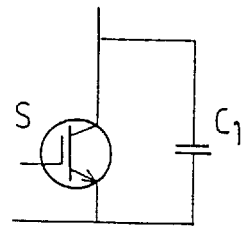
FIG. 2 shows a prior art circuit having a capacitor in parallel with the main switch.
Figure 3:
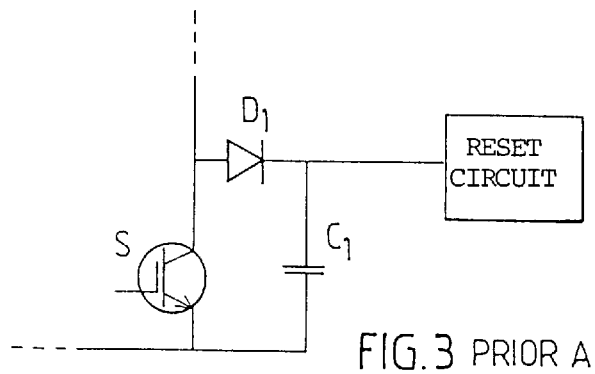
FIG. 3 shows a prior art circuit having a diode, which is preventing the capacitance to discharge through the main switch, a reset circuit to reset the capacitor voltage to zero.
Figure 4:
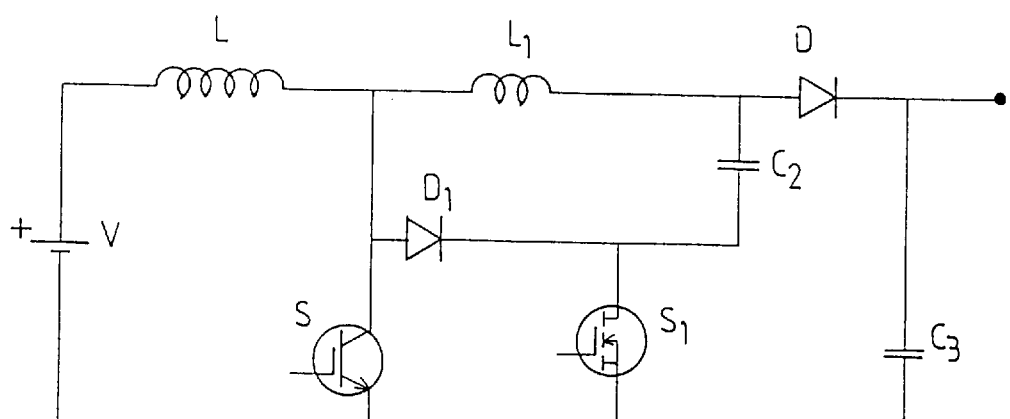
FIG. 4 shows a prior art circuit having a boost DC-to-DC converter, an auxiliary switch is connected in parallel with the main switch.
Figure 5:
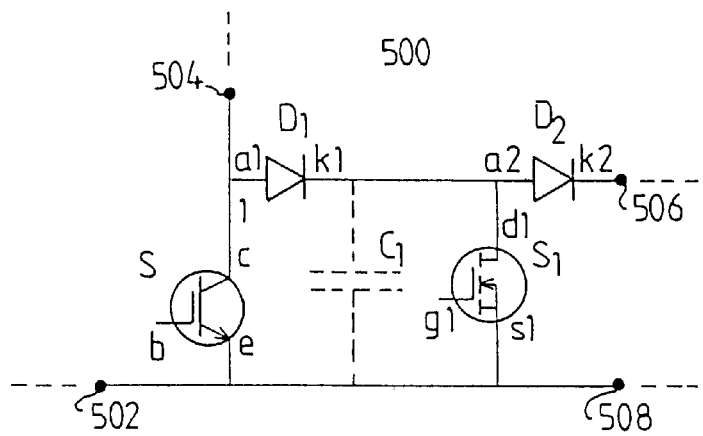
FIG. 5 shows a zerp-voltage-switching (ZVS) snubber circuit, FIG. 6 schematically shows the connection of a load circuit in series with the ZVS circuit in FIG. 5 and a reset circuit.

The invention will now be described with reference to the FIGS. 5 and 6 in which:

FIG. 5 shows a zero-voltage-switching (ZVS) snubber circuit 500, which has an IGBT S working as a main switch. The IGBT snubber circuit 500 is constructed in the following way: a terminal 504 of the IGBT snubber circuit 500 is connected to an anode terminal a1 of a first diode D1 and to a collector terminal c of the main switch S. A first terminal 502 of the IGBT snubber circuit 500 is connected to an emitter terminal e of the main switch S. A cathode terminal k1 of the first diode D1, which is connected to a drain terminal d1 of an auxiliary switch S1, MOSFET. The cathode terminal k1 is also connected to an anode terminal a2 of a blocking diode, D2. A source terminal s1 of the auxiliary switch S1 is connected to a fourth terminal 508 of the IGBT snubber circuit 500 and to the emitter terminal e of the main switch S. A cathode terminal k2 of the blocking diode D2 is connected to a third terminal 506 of the IGBT snubber circuit 500. A first capacitor C1 illustrates the inherent output capacitor of the auxiliary switch S1, or an additional externally added capacitor as shown FIG. 6.

Figure 6:
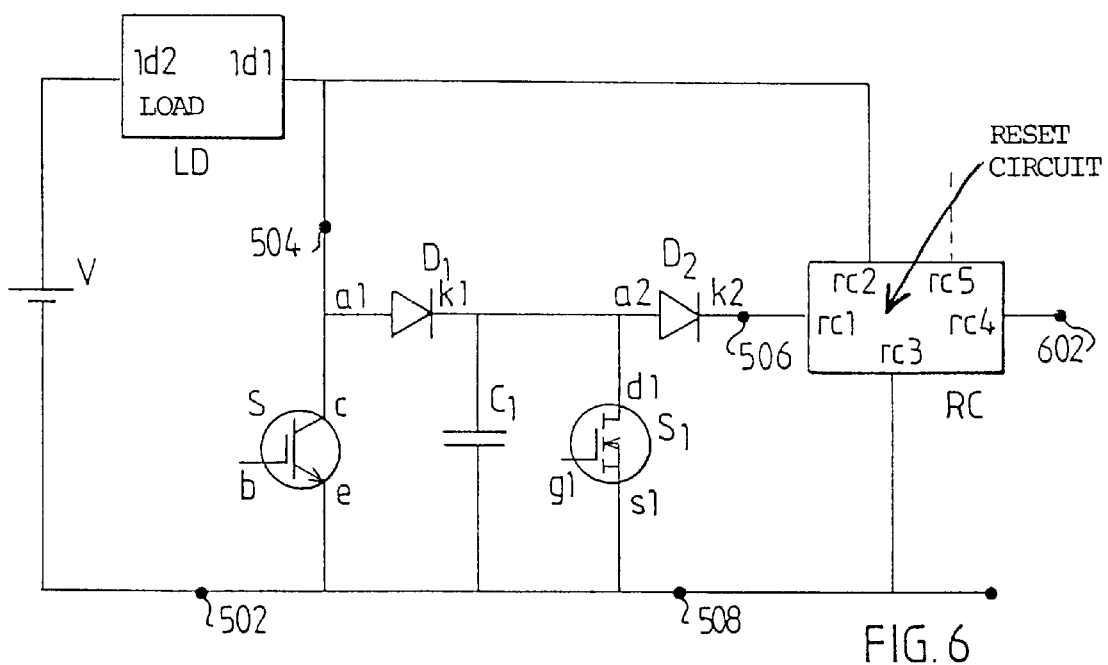

FIG. 6 shows the IGBT snubber circuit 500 as well as voltage source V, a load circuit LD and a reset circuit RC. The voltage source V is in series with the load circuit LD, which is connected to a second terminal 504 of the IGBT snubber circuit 500 including the main switch S and the protection circuit comprising of an auxiliary switch S1, first diode D1, blocking diode D2, first capacitor C1 and reset circuit RC. The voltage source V is connected at one end to a second load terminal ld2 of the load circuit LD and at the other end of the voltage source V is connected to the first terminal 502 of the IGBT snubber circuit 500. A load terminal ld1 of the load circuit LD is connected to a second reset terminal rc2 of the reset circuit RC. The load terminal ld1 of the load circuit LD is also connected to the second terminal 504 of the IGBT snubber circuit 500. A first reset terminal rc1 of the reset circuit RC is connected to the third terminal 506 of the IGBT snubber circuit 500. A third reset terminal rc3 of the reset circuit RC is connected to the fourth terminal 508 of the IGBT snubber circuit 500 and to a first output terminal 604. In addition, a fourth reset terminal rc4 of the reset circuit RC is connected to a second output terminal 602.

Figure 7:
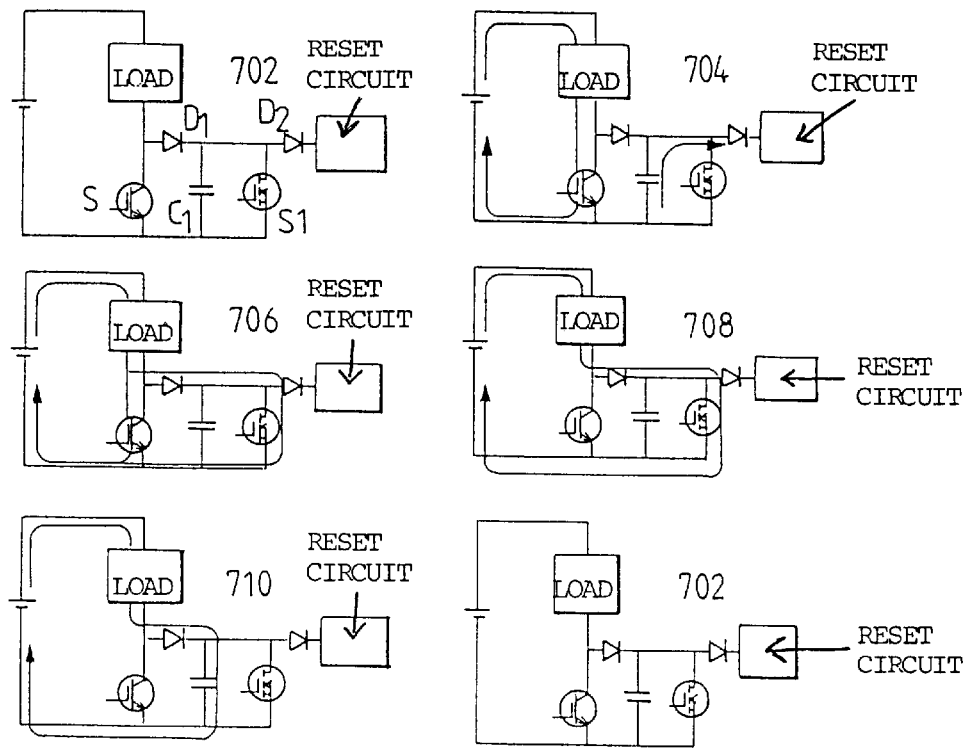
FIG. 7 shows the principle of operation in a sequence of drawings showing the currents flowing in the circuit during different states thereof.

FIG. 7 shows the principle of operation in a sequence of circuits showing the currents flowing in the circuit at different states. Starting from a first state 702, which shows the circuit with no current flowing through any of the switches S, S1 or first capacitor C1, nor the reset circuit RC.

A next state 704 illustrates that the main switch S is conducting. The reset circuit RC is activated so that it will allow the discharging of the first capacitor C1 to a voltage level close to zero volts. In this way the circuit 500 is prepared for the next state during which the auxiliary switch will be turned on at a drain-source voltage close to zero, so called zero-voltage-switching.

During a next state 706, both switches S and S1 are conducting. During this stage, the reset circuit RC does not conduct. The reset circuit RC is kept inactive during the rest of the states described below.

A next state 708 is characterised by turning off the main switch S while the auxiliary switch S1 is still conducting. Now the auxiliary switch S1 conducts all the current, which previously was flowing through both switches S and S1.

A last state 710 is characterised by both switches S and S1 being turned off. The current, which previously flowed through the auxiliary switch S1, is now flowing through the first capacitor C1 and therefore charging the first capacitor C1 to its maximum voltage.

The state 702 completes the cycle, both switches S and S1 are turned off, and no current is flowing through any of the components S, S1, D1, D2, C1, and RC. This state 702 is the same as the first state 702.

In the circuit as described above, the first diode. D1 provides a path enabling the auxiliary switch S1 to take over the current from main switch S, when the main switch S is turned off, and the blocking diode D2 provides a path for the discharging of output capacitance of the auxiliary switch S1 or any other capacitance that may be connected in parallel with the auxiliary switch S1, so that the auxiliary switch S1 can be turned on at zero-voltage condition.

Figure 8:
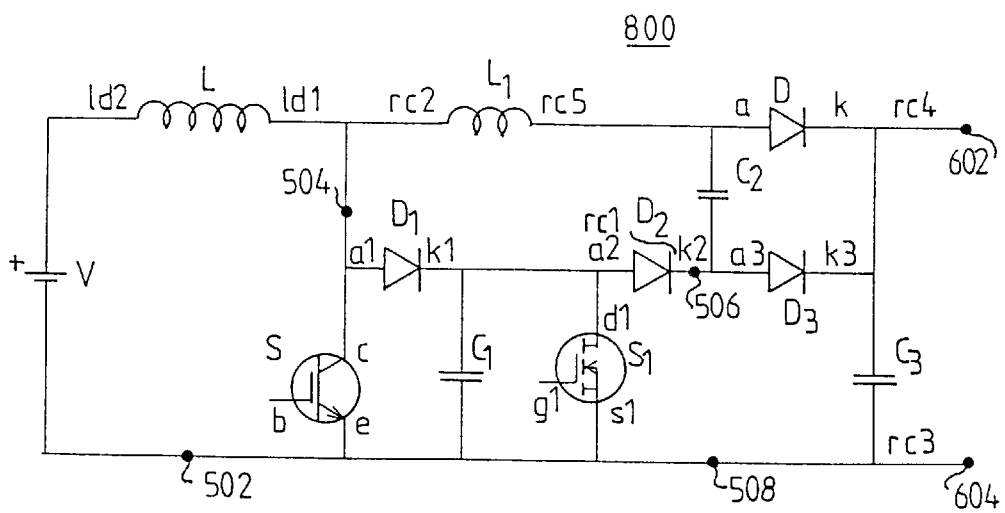
FIG. 8 shows one embodiment of the present invention applied to a boost converter circuit.

FIG. 8 shows an embodiment of the ZVS snubber circuit 500, where the circuit 500 is applied as a boost converter circuit 800. The reset circuit RC comprises a snubber inductor L1, a freewheeling diode D, a third diode D3, second capacitor C2 and a third capacitor C3. The load circuit LD comprises a boost inductor L. The boost converter circuit 800 is also connected to the voltage source V. A negative side of the voltage source V is connected to the first terminal 502 of the IGBT snubber circuit 500, the second terminal of the capacitor C1, the source terminal s1 of the auxiliary switch S1, a second terminal of the first capacitor C1 and to the fourth terminal 508 of the IGBT snubber circuit 500. A positive terminal of the voltage source V is connected to a first terminal of the boost inductor L via the second.load terminal 1d2 of the load circuit LD. A second terminal of the boost inductor L is connected to the load terminal ld1 of the load circuit LD, which in its turn is connected to the second reset terminal rc2 of the reset circuit RC. A first terminal of the snubber inductor L1 is connected to the load terminal ld1 of the load circuit LD via the second reset terminal rc2 of the reset circuit RC. A second terminal of the snubber inductor L1 is connected to an anode terminal of the freewheeling diode D via a fifth reset terminal rc5 of the reset circuit RC. A cathode terminal k of the freewheeling diode D is connected to the fourth reset terminal rc4, which is in its turn connected to the second output terminal 602. The cathode terminal k of the freewheeling diode D is also connected to a first terminal of the third capacitor C3. A first terminal of the second capacitor C2 is connected to the anode terminal a of the freewheeling diode D. The cathode terminal k2 of the blocking diode D2 is connected to the third terminal 506 of the IGBT snubber circuit 500, which in turn is connected to the first reset terminal rc1 of the reset circuit RC. The first reset terminal rc1 is connected to a second terminal of the capacitor C2 and an anode terminal a3 of the third diode D3 connected to the cathode terminal k2 of the blocking diode D2. The cathode terminal k3 of the third diode D3 is connected to the fourth reset terminal rc4.

Figure 9:
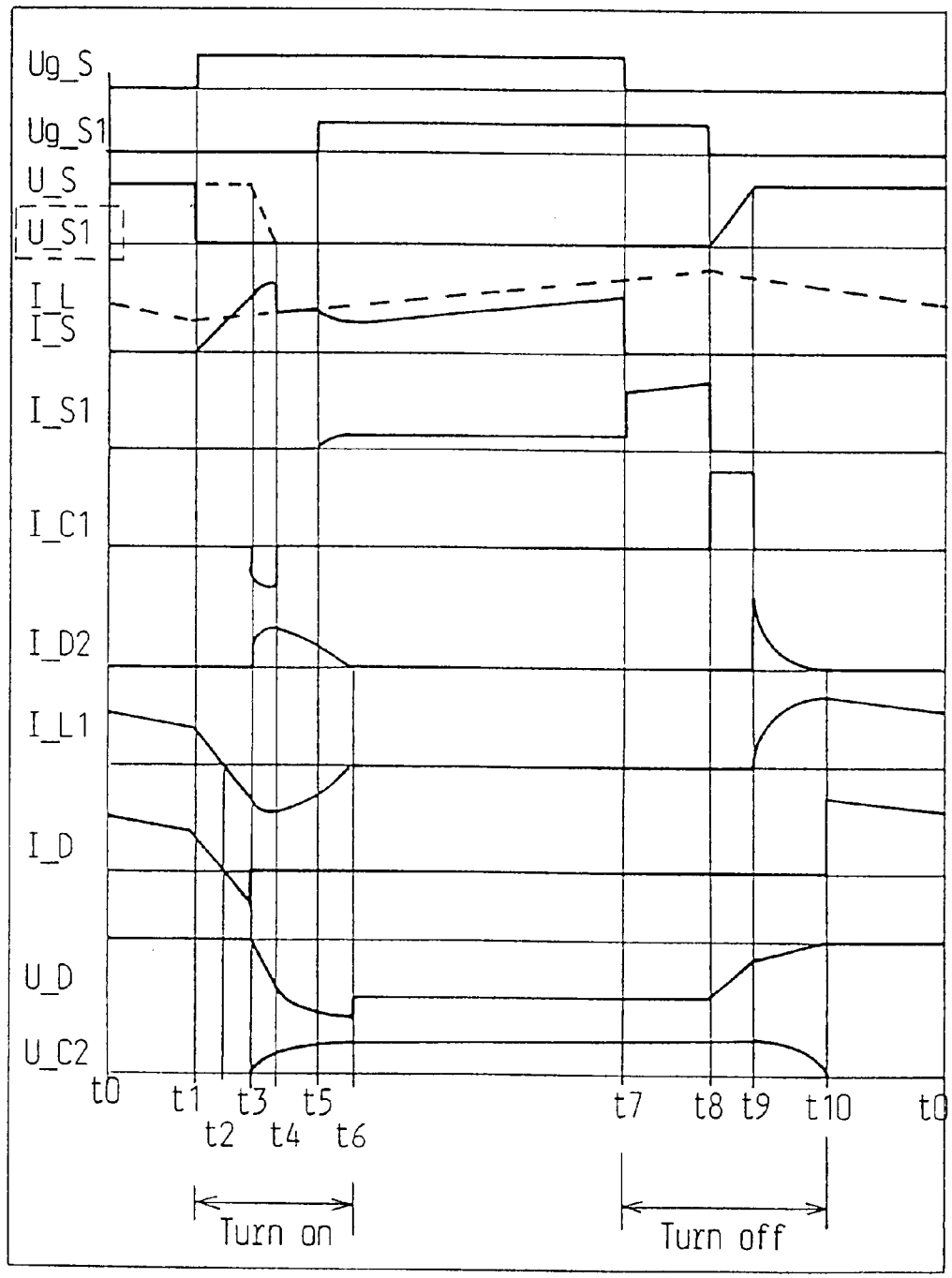
FIG. 9 shows key voltages and current waveforms for the circuit in FIG. 8.
Figure 10:
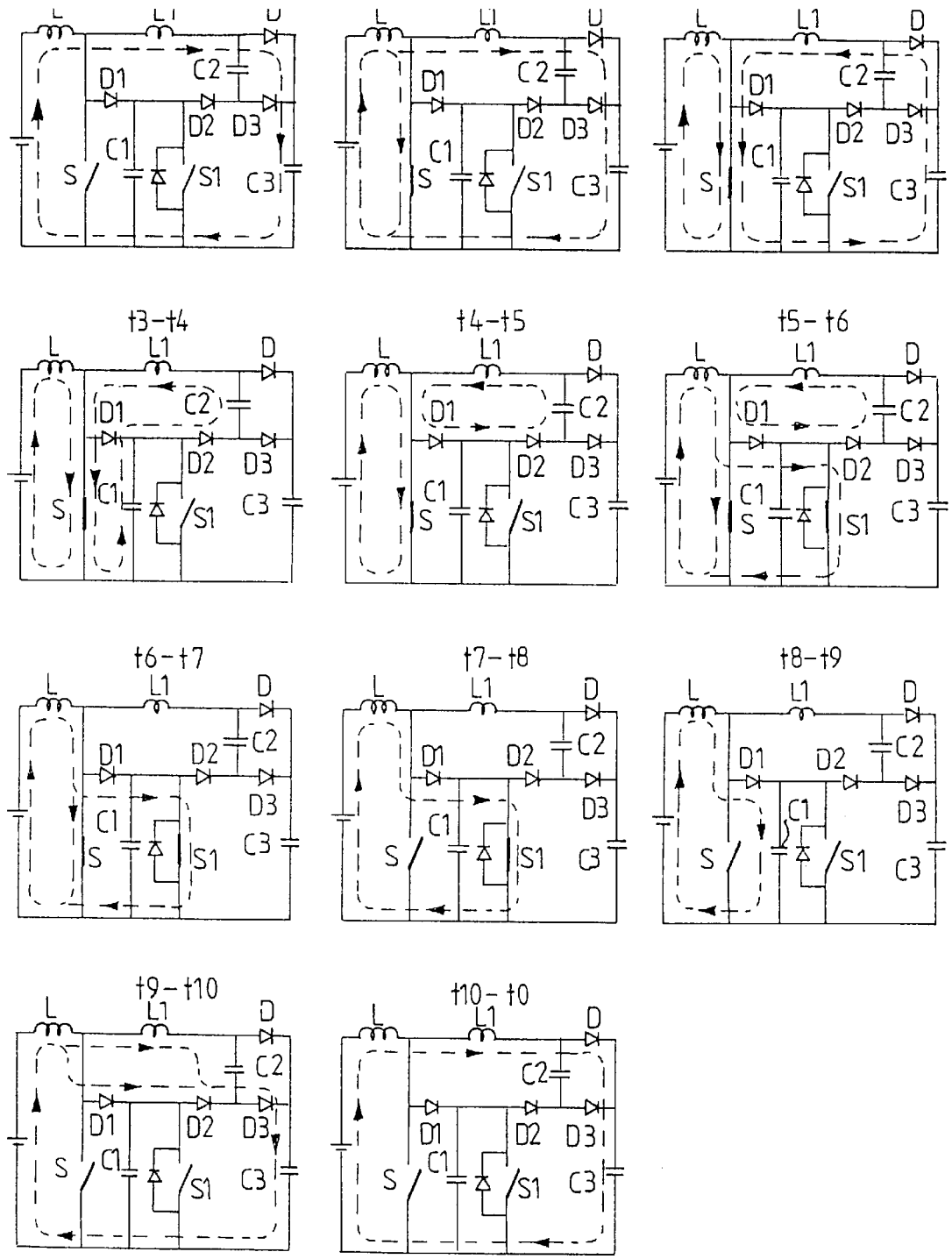
FIG. 10 shows the current paths during the different time steps T0–T10.

FIG. 9 shows the key voltage and current waveforms for the circuit 800 and FIG. 10 shows the current paths in the different time steps T0–T10.

The two switches S and S1 are controlled using the same control signal with a simple delay of the signal to auxiliary switch S1 at both turn-on and turn-off.

The stage T0–T1, shows a freewheeling phase, a starting point, where a main current I_L is passing through the boost inductor L. The main current I_L continues to the snubber inductor L1 becoming an inductor current I_L1. From the inductor the main current is passing through the freewheeling diode D becoming a freewheeling current I_D. Finally, the main current is charging the third capacitor C3, which is the output capacitor C3, is discharge by the equipment connected to the output of the boost converter. This process is not described here.

At T1, the gate signal Ug_S goes high, and the main switch S turns on under zero current condition. By action of the snubber inductor L1 the main switch voltage U_S is changed to a low value. The main switch current I_S through the main switch S is increasing and the inductor current I_L1 and the freewheeling current I_D is decaying with a controlled di/dt-rate determined by the snubber inductor L1 and output voltage.

At T2, the inductor. current I_L1 and the freewheeling current I_D crosses zero and become negative. In T2–T3, the freewheeling diode D is in a reverse recovery state.

In the stage T3–T4, the freewheeling diode D has recovered with a controlled reverse recovery peak current due to the limited di/dt. The main switch S is carrying the whole main current I_L. The first capacitor C1 starts to discharge through the blocking diode D2, the second capacitor C2, the snubber inductor L1 and the discharge current is added to the current in the main switch S. The auxiliary switch voltage U_S1 is gradually changed to a low value.

In the stage T4–T5, the first capacitor C1 is fully discharged and the snubber inductor L1 starts to deliver the energy, that has been stored during T2–T4, through the first diode D1 and the blocking diode D2 to the second capacitor C2.

In the stage T5–T6, the auxiliary switch S1 turns on under zero voltage condition U_S1 and starts to conduct. The auxiliary switch current I_S1 is a minor part of the main current I_L. At the end of this stage, the snubber inductor L1 has delivered all its stored energy to the second capacitor C2, a second capacitor voltage U_C2.

In the stage T6–T7, the main switch S, main switch current I_S, and the auxiliary switch S1, auxiliary switch current I_S1, are sharing the main current I_L.

At T7, the main switch S turns off, gate signal Ug_S is low. The first diode D1 and the auxiliary switch S1, auxiliary switch current I_S1, takes over the whole main current I_L during T7–T8, keeping the voltage over main switch U_S low. The recombination process in the base region of the main switch S is now permitted to take place under low voltage conditions to limit the losses.

At T8–T9, gate signal Ug_S1 goes low and the auxiliary switch S1 turns off under zero-voltage condition, U_S1, due to the first capacitor C1. The first capacitor C1 is charged I_C1 thus limiting dv/dt of the drain-source voltage.

At T9–T10, the diodes D2 and D3 become forward biased, and the diodes D1, D2 and D3 carry the main current I_L, thereby clamping the voltage U_S over the main switches S and the auxiliary switch S1 to the value of the voltage over the third capacitor C3. The secondary capacitor voltage U_C2 of the second capacitor C2 is, during this interval, applied over the snubber inductor L1 This yields an increasing current through the snubber inductor L1, snubber inductor current I_L1 and the current through first diode D1 and blocking diode D2 is decreasing concurrently.

At T10, the second capacitor C2 is discharged and the freewheeling diode D becomes forward biased and starts to conduct the main current I_L. The boost converter circuit 800 is again in the freewheeling phase.

Figure 11:
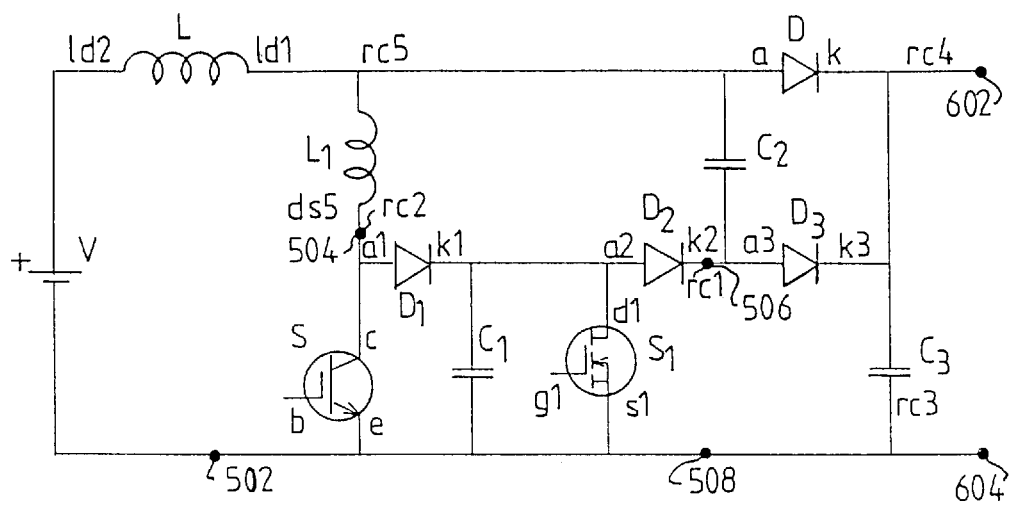
FIG. 11 shows a circuit according to a ssecond embodiment of the present invention applied to a boost converter.

Another embodiment of the ZVS snubber circuit 500, in coorporation with a voltage source V, a load circuit LD and a reset circuit RC, similar to FIG. 8. In this circuit layout, the reset circuit RC is changed, as is shown in FIG. 11. The IGBT snubber circuit 500 is configured with all its terminals 502, 504, 506 and 508 as in FIG. 8. The difference is that the first load terminal ld1 is connected to the fifth terminal rc5 of the reset circuit RC. The second reset terminal rc2 of the reset circuit RC is connected to the second terminal 504 of the IGBT snubber circuit 500. In other regards, the reset circuit RC has the same connections as in FIG. 8.

The invention described above may be embodied in yet other specific forms without departing from the spirit or essential characteristic thereof. Thus, the present embodiments are to be considered in all respect as illustrative and not restrictive, the scope of the invention being indicated by the appended claims rather than by the foregoing description, and all chances, which come within the meaning and range of equivalency of the claims therefore intended to be embraced therein.

What is claimed is:

1. A zero-voltage-switching (ZVS) snubber circuit comprising:
   a main switch;
   an auxiliary switch;
   a load circuit;
   a reset circuit;
   a first diode;

a first capacitor; and a blocking diode, wherein an anode terminal of the blocking diode is connected to the auxiliary switch and a cathode terminal of the blocking diode is connected to the reset circuit.

2. The zero-voltage-switching snubber circuit according to claim 1 wherein the anode terminal of the first diode is connected to a collector terminal of the main switch and the cathode terminal of the first diode is connected to one terminal of the first capacitor.

3. The zero-voltage-switching snubber circuit according to claim 2 wherein the main switch, the first capacitor and the auxiliary switch are connected in parallel.

4. The zero-voltage-switching snubber circuit according to claims 1 further comprising:

a first ZVS terminal is connected to an emitter terminal of the main switch;

a second ZVS terminal is connected to a second reset terminal of the reset circuit, a third ZVS terminal is connected to a first reset terminal of the reset circuit and to the cathode terminal of the blocking diode; and a fourth ZVS terminal is connected to a source terminal of the auxiliary switch.

5. The zero-voltage-switching snubber circuit according to claim 4 wherein the second ZVS terminal is connected to a load terminal of the load circuit.

6. The zero-voltage-switching snubber circuit according to claim 4 wherein the second ZVS terminal is connected to a collector terminal of the main switch and to the anode terminal of the first diode.

7. The zero-voltage-switching snubber circuit according to claim 4 wherein the first capacitor is interconnected between the cathode terminal of the first diode and the emitter terminal of the main switch.

8. The zero-voltage-switching snubber circuit according to claim 4 wherein the anode terminal of the blocking diode is connected to the cathode terminal of the first diode and to a drain terminal of the auxiliary switch.

9. The zero-voltage-switching snubber circuit according to claim 4 wherein the source terminal of the auxiliary switch is connected to the emitter terminal of the main switch.

10. The zero-voltage-switch snubber circuit according to claim 1 wherein at least one of the main switch and auxiliary switch is a semi-conductor switch.

11. A method to reduce a current tail in a zero-voltage-switching snubber circuit at turn-off of a main switch comprising the steps of:

providing the ZVS circuit including the main switch, an auxiliary switch, a load circuit, a reset circuit, a first diode, a first capacitor and a blocking diode wherein an anode terminal of the blocking diode is connected to a drain terminal of an auxiliary switch and wherein a cathode terminal of the blocking diode is connected to the reset circuit; and transferring main current to the auxiliary switch, thereby limiting a voltage at the main switch.

12. A zero-voltage-switching (ZVS) snubber circuit comprising:

a main switch;

an auxiliary switch;

a load circuit;

a reset circuit;

a first diode;

a first capacitor;

a blocking diode, wherein an anode terminal of the blocking diode is connected to the auxiliary switch and a cathode terminal of the blocking diode is connected to the reset circuit; and a first ZVS terminal connected to an emitter terminal of the main switch;

a second ZVS terminal connected to a second reset terminal of the reset circuit, a third ZVS terminal connected to a first reset terminal of the reset circuit and to the cathode terminal of the blocking diode; and a fourth ZVS terminal connected to a source terminal of the auxiliary switch.

13. The zero-voltage-switching snubber circuit according to claim 12 wherein the second ZVS terminal is connected to a load terminal of the load circuit.

14. The zero-voltage-switching snubber circuit according to claim 12 wherein the second ZVS terminal is connected to a collector terminal of the main switch and to the anode terminal of the first diode.

15. The zero-voltage-switching snubber circuit according to claim 12 wherein the first capacitor is interconnected between the cathode terminal of the first diode and the emitter terminal of the main switch.

16. The zero-voltage-switching snubber circuit according to claim 12 wherein the anode terminal of the blocking diode is connected to the cathode terminal of the first diode and to a drain terminal of the auxiliary switch.

17. The zero-voltage-switching snubber circuit according to claim 12 wherein the source terminal of the auxiliary switch is connected to the emitter terminal of the main switch.

18. A zero-voltage-switching (ZVS) snubber circuit comprising:

a main switch;

an auxiliary switch;

a load circuit;

a reset circuit;

a first diode;

a first capacitor;

a blocking diode, wherein an anode terminal of the blocking diode is connected to the auxiliary switch and a cathode terminal of the blocking diode is connected to the reset circuit and wherein the anode terminal of the first diode is connected to a collector terminal of the main switch and the cathode terminal of the first diode is connected to one terminal of the first capacitor; and a first ZVS terminal connected to an emitter terminal of the main switch;

a second ZVS terminal connected to a second reset terminal of the reset circuit, a third ZVS terminal connected to a first reset terminal of the reset circuit and to the cathode terminal of the blocking diode; and a fourth ZVS terminal connected to a source terminal of the auxiliary switch.

19. The zero-voltage-switching snubber circuit according to claim 18 wherein the second ZVS terminal is connected to a load terminal of the load circuit.

20. The zero-voltage-switching snubber circuit according to claim 18 wherein the second ZVS terminal is connected to a collector terminal of the main switch and to the anode terminal of the first diode.

22. The zero-voltage-switching snubber circuit according to claim 18 wherein the first capacitor is interconnected between the cathode terminal of the first diode and the emitter terminal of the main switch.

22. The zero-voltage-switching snubber circuit according to claim 18 wherein the anode terminal of the blocking diode is connected to the cathode terminal of the first diode and to a drain terminal of the auxiliary switch.

23. The zero-voltage-switching snubber circuit according to claim 18 wherein the source terminal of the auxiliary switch is connected to the emitter terminal of the main switch.

\* \* \* \* \*